United States Patent
Lindman et al.

[11] Patent Number: 5,974,655
[45] Date of Patent: Nov. 2, 1999

[54] METHOD OF MOUNTING LOUDSPEAKERS AND A LOUDSPEAKER MOUNTING

[75] Inventors: Lennart Lindman, Tyresö; Ronny Mellgren, Enskede; Sune Gustafsson, Tyresö, all of Sweden

[73] Assignee: Telefonaktiebolaget LM Ericsson, Stockholm, Sweden

[21] Appl. No.: 08/765,364

[22] PCT Filed: Oct. 25, 1996

[86] PCT No.: PCT/SE96/01376

§ 371 Date: Jan. 7, 1997

§ 102(e) Date: Jan. 7, 1997

[87] PCT Pub. No.: WO97/16913

PCT Pub. Date: May 9, 1997

[30] Foreign Application Priority Data

Nov. 3, 1995 [SE] Sweden ................................. 9503884

[51] Int. Cl.⁶ .................................................. H04R 31/00
[52] U.S. Cl. .................................................. 29/594
[58] Field of Search ................................. 381/150, 188, 381/205; 29/594

[56] References Cited

U.S. PATENT DOCUMENTS 4,931,029  6/1990  Hwang .................................. 446/396

FOREIGN PATENT DOCUMENTS

| 0 203 680 A2 | 12/1986 | European Pat. Off. . |
| 0 218 832 A1 | 4/1987 | European Pat. Off. . |
| 3346461 A1 | 7/1985 | Germany . |
| 451933 | 11/1987 | Sweden . |
| 2 064 264 | 6/1981 | United Kingdom . |
| WO 85/03613 A1 | 8/1985 | WIPO . |

*Primary Examiner*—David A. Scherbel
*Assistant Examiner*—Benjamin M. Halpern
*Attorney, Agent, or Firm*—Burns, Doane, Swecker & Mathis, L.L.P.

[57] ABSTRACT

With the intention of simplifying the manner in which a loudspeaker is mounted on a circuit board while maintaining requisite sealing and damping between the loudspeaker and the circuit board, the loudspeaker is affixed directly to the circuit board (1) by means of a double-side adhesive annulus (3) with the diaphragm of the loudspeaker facing towards the board, wherein the board has holes (4) located opposite the loudspeaker. The number of holes (4) provided and the size of the holes may be adapted to provide the best sound production in accordance with application. When a loudspeaker is mounted in this way, all components can be collected on the circuit board and therewith simplify manufacture of the telephone apparatus as such, irrespective of whether the circuit board is in the handset or some other part of the apparatus.

4 Claims, 1 Drawing Sheet

METHOD OF MOUNTING LOUDSPEAKERS AND A LOUDSPEAKER MOUNTING

FIELD OF INVENTION

The present invention relates to a method of mounting at least one loudspeaker, and a loudspeaker mounting arranged in accordance with the method, for instance telephone handsets. Depending partly on their field of use, communications equipment may often include at least one microphone and at least one loudspeaker, which may be fixedly mounted in the equipment.

DESCRIPTION OF THE BACKGROUND ART

There are several ways in which a loudspeaker can be fitted to communications equipment. At present, the usual way is to mount the circuit board and loudspeaker separately in a plastic casing with some form of connection therebetween. The loudspeaker is most often suspended softly in a rubber for instance, so as to avoid resonances in a surrounding structure. In those instances when the loudspeakers are mounted on circuit boards, the loudspeakers are always placed with their diaphragms facing away from the board. Loudspeaker mounting processes are required to be simple and inexpensive and the mounting shall fulfill the acoustic requirements placed on the mounting.

DE-A1-3346461 teaches a method of mounting electroacoustic transducers on a conductor plate that has holes opposite the transducers.

SE-B-451933 teaches a loudspeaker equipped arrangement in which the loudspeaker is mounted in a hole in the circuit board with the diaphragm facing away from the circuit board and with a vibration damping ring placed between the hole and the loudspeaker.

DE-A1-3003714 teaches a telephone apparatus that has an electroacoustic transducer mounted on a circuit board.

SUMMARY OF THE INVENTION

With the intention of simplifying the mounting of a loudspeaker on a circuit board in a telephone apparatus while still obtaining the requisite seal and damping between the loudspeaker and the board so as to achieve good sound production, the loudspeaker has been affixed to the board with double adhesive tape with the diaphragm facing towards the board, which has at least one hole located opposite the loudspeaker. The number of holes provided and the size of said holes can be adapted to provide the best sound production, depending on application. With this type of loudspeaker mounting, all components can be collected on the board, therewith simplifying manufacture of the telephone apparatus as such, irrespective of whether the circuit board is in the handheld (receiver) part of the telephone apparatus or in some other part thereof.

DETAILED DESCRIPTION OF A PREFERRED EMBODIMENT

Figure 1:
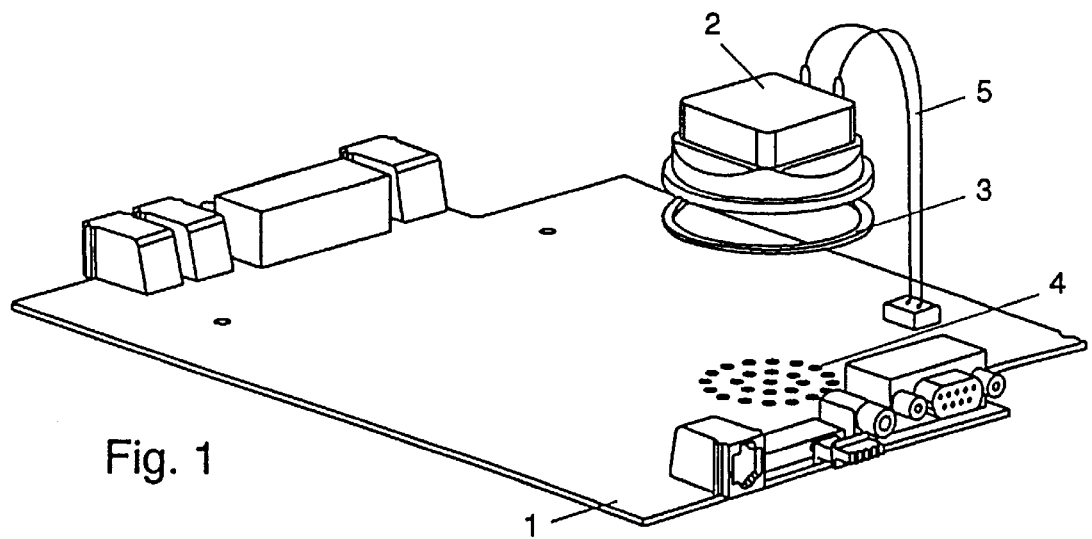
FIG. 1 shows a stage in an inventive loudspeaker mounting process prior to mounting the loudspeaker.

FIG. 1 is a simplified illustration of a telephone apparatus circuit board 1 that has an integrated loudspeaker circuit. A loudspeaker 2 is shown in a position prior to lowering and affixing the loudspeaker onto the circuit board 1. Located between the loudspeaker and the circuit board is a flat ring 3 which may be comprised of elastic double-adhesive material, such as elastic double adhesive tape. The circuit board is perforated with holes 4 in the region beneath the loudspeaker for production of loudspeaker sound. The loudspeaker is connected electrically to the circuit board by twin conductors 5. In the illustrated case, the means by which the necessary seal against the board and the transmission of occurrent mechanical vibrations are dampened has the form of an adhesive tape annulus.

Figure 2:
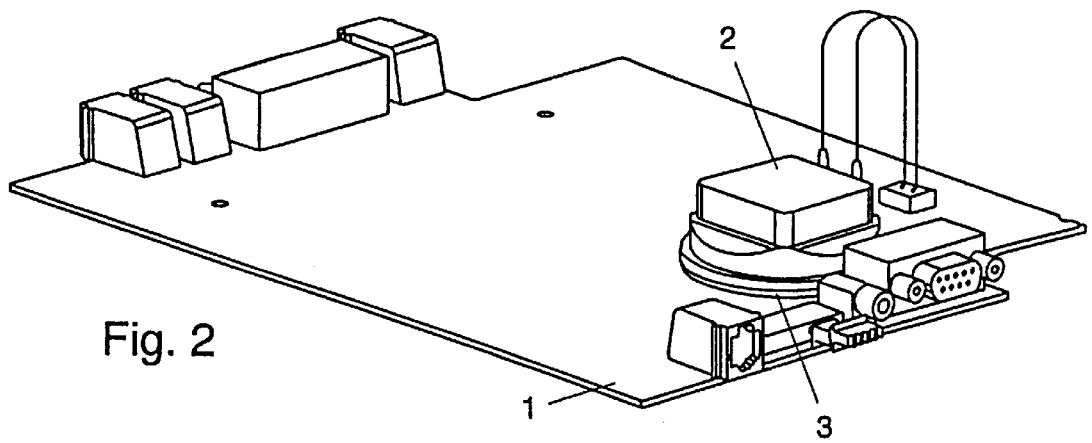
FIG. 2 shows an inventive loudspeaker mounting.

FIG. 2 shows the loudspeaker firmly mounted on the circuit board with the aid of the adhesive tape annulus, with the loudspeaker diaphragm facing towards the board in the region of the holes 4.

The actual procedure of mounting the loudspeaker on the board is preceded by securing an adhesive annulus 3 to the board 1 after having positioned the annulus in accordance with markings on the board. When the annulus has been fixed in position, the loudspeaker 2 is pressed onto the annulus. It has been found that the bond afforded by a double adhesive annulus, ie an annulus that is adhesive on both sides, is sufficiently strong to resist comprehensive shaking forces, without requiring the assistance of additional fasteners such as screws to this end. Mounting of the loudspeaker is thus a relatively simple process that requires no further connecting means. When the tape used is more or less elastic, it can be used as a soft loudspeaker suspension, therewith obviating the need to use typical rubber packings to this end. The use of hard and non-elastic material is also conceivable, although this use will depend on the application of the invention. When the loudspeaker is mounted in accordance with the invention, the circuit board 1 can be used as a baffle to produce a high sound volume. The holes 4 in the circuit board may also be optimized with respect to prevailing acoustic requirements. The loudspeaker may be mounted on the same side as or on the opposite to other board mounted components, depending on use. In the case of conference telephones, loudspeaking telephones or a telephone apparatus having a call distribution function, a switching center for instance, the loudspeaker may be placed facing down towards or facing upwardly away from an underlying supportive surface and intended to deliver acoustic signal and also speech signals. For instance, the wiring of a fixed or a mobile telephone apparatus having a circuit board in a combined transceiver unit that includes components and keypad will be greatly simplified when the loudspeaker is mounted directly on the circuit board, said board including sound production holes opposite the loudspeaker diaphragm. Wiring between loudspeaker and remaining circuit components is simplified when the loudspeaker is mounted in the aforesaid manner. The entire electronic unit may consist in one single board when the loudspeaker circuit is integrated in this way.

We claim:

1. A method of mounting a loudspeaker having a diaphragm in a communications equipment, comprising the steps of:

securing the loudspeaker to a perforated circuit board using an annulus comprised of double-sided adhesive material located between the loudspeaker and the perforated circuit board; and positioning the loudspeaker such that the diaphragm of the loudspeaker faces towards the perforated circuit board.

2. A loudspeaker mounting assembly for a communications equipment, comprising:

a perforated circuit board having holes;

a loudspeaker having a diaphragm affixed to the perforated circuit board; and an annulus comprised of a double-sided adhesive material located between the loudspeaker and the circuit board for positioning the diaphragm of the loudspeaker facing towards the holes of the perforated circuit board.

3. A mounting means according to claim 2, wherein the adhesive material is soft and elastic.

4. A mounting means according to claim 2, wherein the adhesive material is hard and non-elastic.

* * * * *